(12) United States Patent
Matsuda et al.

(10) Patent No.: US 11,585,717 B2
(45) Date of Patent: Feb. 21, 2023

(54) METHOD FOR CALIBRATING PLURALITY OF CHAMBER PRESSURE SENSORS AND SUBSTRATE PROCESSING SYSTEM

(71) Applicant: Tokyo Electron Limited, Tokyo (JP)

(72) Inventors: Risako Matsuda, Miyagi (JP); Norihiko Amikura, Miyagi (JP); Kazuyuki Miura, Miyagi (JP); Keita Shouji, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 528 days.

(21) Appl. No.: 16/806,628

(22) Filed: Mar. 2, 2020

(65) Prior Publication Data

US 2020/0292403 A1  Sep. 17, 2020

(30) Foreign Application Priority Data

Mar. 11, 2019  (JP) .............................. JP2019-043495

(51) Int. Cl.
| | |
|---|---|
| *G01L 27/00* | (2006.01) |
| *G01F 3/22* | (2006.01) |
| *G01F 5/00* | (2006.01) |
| *H01L 21/67* | (2006.01) |
| *H01L 21/66* | (2006.01) |

(52) U.S. Cl.
CPC ............ *G01L 27/005* (2013.01); *G01F 3/221* (2013.01); *G01F 5/005* (2013.01); *H01L 21/67017* (2013.01); *H01L 21/67253* (2013.01); *H01L 22/26* (2013.01)

(58) Field of Classification Search
CPC ....... G01L 27/005; G01F 3/221; G01F 5/005; H01L 21/67253; H01L 21/67017; H01L 22/26
See application file for complete search history.

(56) References Cited

U.S. PATENT DOCUMENTS

| | | | | |
|---|---|---|---|---|
| 2011/0265549 | A1* | 11/2011 | Cruse | .................. F16K 37/0091 |
| | | | | 73/1.16 |
| 2018/0073911 | A1* | 3/2018 | Amikura | ............. G01F 25/0092 |
| 2018/0188101 | A1* | 7/2018 | Weindl | ..................... G01F 25/14 |

FOREIGN PATENT DOCUMENTS

| | | |
|---|---|---|
| JP | H10-308383 A | 11/1998 |
| JP | 2010-251464 A | 11/2010 |
| JP | 2017-167102 A | 9/2017 |
| JP | 2019-009249 A | 1/2019 |

\* cited by examiner

*Primary Examiner* — Melissa J Koval
*Assistant Examiner* — Joseph O Nyamogo
(74) *Attorney, Agent, or Firm* — Studebaker & Brackett PC

(57) ABSTRACT

In a substrate processing system according to an exemplary embodiment, gas supply units are configured to supply gases to chambers through first gas flow channels thereof, respectively. Chamber pressure sensors are configured to measure pressures in the chambers. A second gas flow channel is connected to the first gas flow channel of each of the gas supply units. A reference pressure sensor is configured to measure a pressure in the second gas flow channel. In a method according to an exemplary embodiment, each of the chamber pressure sensors is calibrated by using a measurement value thereof and a measurement value of the reference pressure sensor which are obtained in a state where pressures in a corresponding chamber, the first gas flow channel of a corresponding gas supply unit, and the second gas flow channel are maintained.

16 Claims, 3 Drawing Sheets

METHOD FOR CALIBRATING PLURALITY OF CHAMBER PRESSURE SENSORS AND SUBSTRATE PROCESSING SYSTEM

CROSS-REFERENCE TO RELATED APPLICATIONS

This application is based on and claims the benefit of priority from Japanese Patent Application No. 2019-043495 filed on Mar. 11, 2019, the entire contents of which are incorporated herein by reference.

FIELD

Exemplary embodiments of the present disclosure relate to a method for calibrating a plurality of chamber pressure sensors and a substrate processing system.

BACKGROUND

A substrate processing apparatus is used in manufacturing of an electronic device. The substrate processing apparatus includes a chamber. During substrate processing, a gas is supplied into the chamber in a state where a substrate is disposed in the chamber. A pressure in the chamber affects substrate processing results. Therefore, the pressure in the chamber is measured by a pressure sensor. A state of the pressure sensor may be changed over time. Therefore, the pressure sensor is required to be calibrated.

Japanese Patent Application Laid-Open Publication No. 2010-251464 discloses calibration of a pressure sensor in a substrate processing apparatus. Japanese Patent Application Laid-Open Publication No. 2010-251464 discloses that two pressure sensors are used to measure a pressure in a chamber. One pressure sensor of the two pressure sensors is used to measure the pressure in the chamber during the substrate processing. The other pressure sensor of the two pressure sensors is used to calibrate the one pressure sensor. Specifically, the one pressure sensor is calibrated so that a measurement value thereof becomes the same as a measurement value of the other pressure sensor.

SUMMARY

In an exemplary embodiment, there is provided a method for calibrating a plurality of chamber pressure sensors in a substrate processing system. The substrate processing system is provided with a plurality of chambers, a plurality of chamber pressure sensors, a plurality of gas supply units, and a plurality of exhaust apparatuses. The plurality of chamber pressure sensors are provided to measure pressures in a plurality of chambers, respectively. Each of the plurality of gas supply units is configured to supply a gas to an internal space of the corresponding chamber among the plurality of chambers. Each of the plurality of gas supply units includes a flow rate controller, a primary valve, a secondary valve, and a first gas flow channel. The primary valve is connected to a primary side of the flow rate controller. The secondary valve is connected to a secondary side of the flow rate controller. The first gas flow channel includes a first end, a second end, and a third end. The first end is connected to the secondary valve. The third end is connectable to the internal space of the corresponding chamber. The plurality of exhaust apparatuses are connected to internal spaces of the plurality of chambers through a plurality of exhaust flow channels, respectively. The substrate processing system further includes a second gas flow channel and a reference pressure sensor. The second gas flow channel is connected to the second end of each of the plurality of gas supply units. The reference pressure sensor is provided to measure a pressure in the second gas flow channel.

The method according to the exemplary embodiment includes forming a state where a pressure is maintained in a selected space. The selected space includes the first gas flow channel of a selected gas supply unit among the plurality of gas supply units, the second gas flow channel, and the internal space of a selected chamber corresponding to the selected gas supply unit among the plurality of chambers. The state is formed by the gas supplied from the selected gas supply units or an other gas supply unit at a set pressure. The method further includes acquiring a plurality of first pressure measurement values which are measurement values of the pressure in the selected chamber in the state by using a selected chamber pressure sensor for the selected chamber among the plurality of chamber pressure sensors. The method further includes acquiring a plurality of second pressure measurement values which are measurement values of the pressure in the second gas flow channel in the state by using the reference pressure sensor. The method further includes calibrating the selected chamber pressure sensor to eliminate a difference between a pressure measurement value of the selected chamber pressure sensor, which is equal to an average value of the plurality of first pressure measurement values, and an average value of the plurality of second pressure measurement values. In the method, a sequence including the forming a state, the acquiring a plurality of first pressure measurement values, the acquiring a plurality of second pressure measurement values, and the calibrating the selected chamber pressure sensor is repeated, by using a plurality of different set pressures as the set pressure respectively. In the method, the plurality of chamber pressure sensors are selected in order as the selected chamber pressure sensor and the sequence is repeated.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
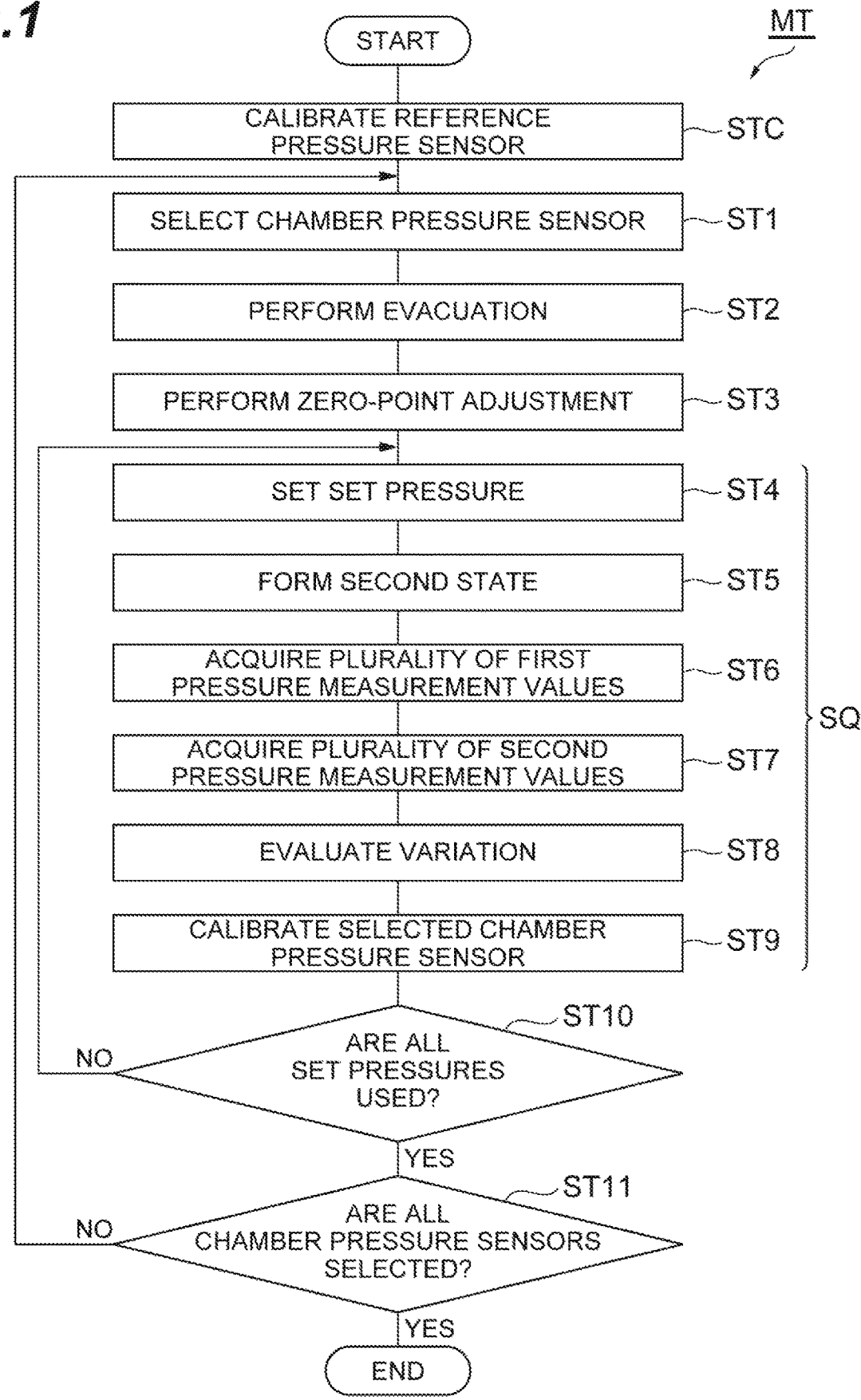
FIG. 1 is a flow diagram illustrating a method for calibrating a plurality of chamber pressure sensors in a substrate processing system according to an exemplary embodiment.

Hereinafter, various exemplary embodiments will be described.

In an exemplary embodiment, there is provided a method for calibrating a plurality of chamber pressure sensors in a substrate processing system. The substrate processing system is provided with a plurality of chambers, a plurality of chamber pressure sensors, a plurality of gas supply units, and a plurality of exhaust apparatuses. The plurality of chamber pressure sensors are provided to measure pressures in a plurality of chambers, respectively. Each of the plurality of gas supply units is configured to supply a gas to an internal space of the corresponding chamber among the plurality of chambers. Each of the plurality of gas supply units includes a flow rate controller, a primary valve, a secondary valve, and a first gas flow channel. The primary valve is connected to a primary side of the flow rate controller. The secondary valve is connected to a secondary side of the flow rate controller. The first gas flow channel includes a first end, a second end, and a third end. The first end is connected to the secondary valve. The third end is connectable to the internal space of the corresponding chamber. The plurality of exhaust apparatuses are connected to internal spaces of the plurality of chambers through a plurality of exhaust flow channels, respectively. The substrate processing system further includes a second gas flow channel and a reference pressure sensor. The second gas flow channel is connected to the second end of each of the plurality of gas supply units. The reference pressure sensor is provided to measure a pressure in the second gas flow channel.

The method according to the exemplary embodiment includes forming a state where a pressure is maintained in a selected space. The selected space includes the first gas flow channel of a selected gas supply unit among the plurality of gas supply units, the second gas flow channel, and the internal space of a selected chamber corresponding to the selected gas supply unit among the plurality of chambers. The state is formed by the gas supplied from the selected gas supply units or an other gas supply unit at a set pressure. The method further includes acquiring a plurality of first pressure measurement values which are measurement values of the pressure in the selected chamber in the state by using a selected chamber pressure sensor for the selected chamber among the plurality of chamber pressure sensors. The method further includes acquiring a plurality of second pressure measurement values which are measurement values of the pressure in the second gas flow channel in the state by using the reference pressure sensor. The method further includes calibrating the selected chamber pressure sensor to eliminate a difference between a pressure measurement value of the selected chamber pressure sensor, which is equal to an average value of the plurality of first pressure measurement values, and an average value of the plurality of second pressure measurement values. In the method, a sequence including the forming a state, the acquiring a plurality of first pressure measurement values, the acquiring a plurality of second pressure measurement values, and the calibrating the selected chamber pressure sensor is repeated, by using a plurality of different set pressures as the set pressure respectively. In the method, the plurality of chamber pressure sensors are selected in order as the selected chamber pressure sensor and the sequence is repeated.

According to the method in the embodiment, the plurality of chamber pressure sensors are calibrated by using one reference pressure sensor. Therefore, a machine difference of the plurality of chamber pressure sensors is reduced. In addition, the plurality of chamber pressure sensors are calibrated by using the measurement value of the pressure in the common second gas flow channel acquired by the reference pressure sensor. Therefore, the calibration of the plurality of chamber pressure sensors may be easily performed.

In an exemplary embodiment, the substrate processing system may further include a plurality of flow splitters, a plurality of distribution flow channel groups, a plurality of gas injection units, a plurality of valves, and a plurality of pressure control valves. Each of the plurality of flow splitters is connected to a third end of a corresponding gas supply unit among a plurality of gas supply units. Each of the plurality of distribution flow channel groups includes a plurality of distribution flow channels. The plurality of distribution flow channels connect a corresponding flow splitter among the plurality of flow splitters to a corresponding chamber among the plurality of chambers. Each of the plurality of gas injection units is provided to inject a gas to one distribution flow channel included in the plurality of distribution flow channels of a corresponding distribution flow channel group among the plurality of distribution flow channel groups. Each of the plurality of valves is connected between the one distribution flow channel of the corresponding distribution flow channel group among the plurality of distribution flow channel groups and the corresponding flow splitter among the plurality of flow splitters. The plurality of pressure control valves are provided between the plurality of chambers and the plurality of exhaust apparatuses, respectively, and configured to adjust pressures in the plurality of chambers, respectively. In the forming a state, a selected valve among the plurality of valves is closed. The selected valve is connected between the one distribution flow channel connected to the selected chamber and a flow splitter for the selected chamber among the plurality of flow splitters. In the forming a state, a gas may be supplied from a gas injection unit for the one distribution flow channel connected to the selected chamber among the plurality of gas injection units as the other gas supply unit to the selected space further including the one distribution flow channel connected to the selected chamber. In the forming a state, a pressure in the selected chamber may be adjusted to the set pressure by a pressure control valve for the selected chamber among the plurality of pressure control valves.

In an exemplary embodiment, the substrate processing system further includes the plurality of pressure control valves. The plurality of pressure control valves are provided between the plurality of chambers and the plurality of exhaust apparatuses, respectively, and configured to adjust pressures in the plurality of chambers, respectively. In the forming a state, the gas may be supplied from the selected gas supply unit to the selected space in a state where the pressure control valve for the selected chamber among the plurality of pressure control valves is closed.

In an exemplary embodiment, the method may further include adjusting zero-point of the selected chamber pressure sensor before the forming a state in the sequence. The adjusting zero-point is performed in a state where the selected space is evacuated.

In an exemplary embodiment, the method may further include comparing each of the plurality of first pressure measurement values with an average value of the plurality of first pressure measurement values in the sequence.

In an exemplary embodiment, the method may further include comparing each of the plurality of second pressure measurement values with an average value of the plurality of second pressure measurement values in the sequence.

In an exemplary embodiment, the method may further include performing calibration of a first reference pressure sensor which is the reference pressure sensor before repeating the sequence performed in order with respect to the plurality of chamber pressure sensors. The performing the calibration of the first reference pressure sensor includes connecting a second reference pressure sensor to the second gas flow channel. The performing the calibration of the first reference pressure sensor further includes forming an other state where a pressure in a target space is maintained. The target space includes the first gas flow channel of one gas supply unit among the plurality of gas supply units, the second gas flow channel, and an internal space of one chamber corresponding to the one gas supply unit among the plurality of chambers. The other state is formed by a gas supplied from the one gas supply unit or the other gas supply unit at a calibration pressure. The performing the calibration of the first reference pressure sensor further includes acquiring a plurality of third pressure measurement values which are measurement values of the pressure in the second gas flow channel in the other state by using the first reference pressure sensor. The performing the calibration of the first reference pressure sensor further includes acquiring a plurality of fourth pressure measurement values which are measurement values of the pressure in the second gas flow channel in the other state by using the second reference pressure sensor. The performing the calibration of the first reference pressure sensor further includes calibrating the first reference pressure sensor to eliminate a difference between a pressure measurement value of the first reference pressure sensor, which is equal to an average value of the plurality of third pressure measurement values, and an average value of the plurality of fourth pressure measurement values. In this embodiment, an other sequence is repeated. The other sequence includes the forming an other state, the acquiring a plurality of third pressure measurement values, the acquiring a plurality of fourth pressure measurement values, and the calibrating the first reference pressure sensor. A plurality of different calibration pressures are used in the repetition of the other sequence as the calibration pressure.

In an exemplary embodiment, the substrate processing system may further include a plurality of flow splitters, a plurality of distribution flow channel groups, a plurality of gas injection units, a plurality of valves, and a plurality of pressure control valves. Each of the plurality of flow splitters is connected to a third end of a corresponding gas supply unit among a plurality of gas supply units. Each of the plurality of distribution flow channel groups includes a plurality of distribution flow channels. The plurality of distribution flow channels connect a corresponding flow splitter among the plurality of flow splitters to a corresponding chamber among the plurality of chambers. Each of the plurality of gas injection units is provided to inject a gas to one distribution flow channel included in the plurality of distribution flow channels of a corresponding distribution flow channel group among the plurality of distribution flow channel groups. Each of the plurality of valves is connected between the one distribution flow channel of the corresponding distribution flow channel group among the plurality of distribution flow channel groups and the corresponding flow splitter among the plurality of flow splitters. The plurality of pressure control valves are provided between the plurality of chambers and the plurality of exhaust apparatuses, respectively, and configured to adjust the pressure in the plurality of chambers, respectively. In the forming an other state, one valve among the plurality of valves may be closed. The one valve is connected between the one distribution flow channel connected to the one chamber and a flow splitter for the one chamber among the plurality of flow splitters. In the forming an other state, a gas may be supplied from a gas injection unit for the one distribution flow channel connected to the one chamber among the plurality of gas injection units as the other gas supply unit to the target space further including the one distribution flow channel connected to the one chamber. In the forming an other state, a pressure in the one chamber may be adjusted to the calibration pressure by a pressure control valve for the one chamber among the plurality of pressure control valves.

In an exemplary embodiment, the substrate processing system further includes the plurality of pressure control valves. The plurality of pressure control valves are provided between the plurality of chambers and the plurality of exhaust apparatuses, respectively, and configured to adjust the pressure in the plurality of chambers, respectively. In the forming an other state, the gas may be supplied from the one gas supply unit to an internal space of the one chamber in a state where the pressure control valve for the one chamber among the plurality of pressure control valves is closed.

In an exemplary embodiment, the method may further include adjusting zero-point of each of the first reference pressure sensor and the second reference pressure sensor before repeating the other sequence. The adjusting zero-point is performed in a state where the target space is evacuated.

In an exemplary embodiment, the method may further include comparing each of the plurality of third pressure measurement values with an average value of the plurality of third pressure measurement values in the other sequence.

In an exemplary embodiment, the method may further include comparing each of the plurality of fourth pressure measurement values with an average value of the plurality of fourth pressure measurement values in the other sequence.

In another exemplary embodiment, there is provided a substrate processing system. The substrate processing system is provided with a plurality of chambers, a plurality of chamber pressure sensors, a plurality of gas supply units, and a plurality of exhaust apparatuses. The plurality of chamber pressure sensors are provided to measure pressures in a plurality of chambers, respectively. Each of the plurality of gas supply units is configured to supply a gas to an internal space of the corresponding chamber among the plurality of chambers. Each of the plurality of gas supply units includes a flow rate controller, a primary valve, a secondary valve, and a first gas flow channel. The primary valve is connected to a primary side of the flow rate controller. The secondary valve is connected to a secondary side of the flow rate controller. The first gas flow channel includes a first end, a second end, and a third end. The first end is connected to the secondary valve. The third end is connectable to the internal space of the corresponding chamber. The plurality of exhaust apparatuses are connected to internal spaces of the plurality of chambers through a plurality of exhaust flow channels, respectively. The substrate processing system further includes a second gas flow channel and a reference pressure sensor. The second gas flow channel is connected to the second end of each of the plurality of gas supply units. The reference pressure sensor is provided to measure a pressure in the second gas flow channel. The substrate processing system further includes a controller. The controller is configured to perform control for calibration of the plurality of chamber pressure sensors.

The controller is configured to perform repetition of control sequence by selecting the plurality of chamber pressure sensors in order as the selected chamber pressure sensor and using a plurality of different set pressures as the set pressure, respectively. The control sequence includes a first control, a second control, a third control, and calibration of the selected chamber pressure sensor. In the first control, the controller controls the selected gas supply unit or the other gas supply unit among the plurality of gas supply units. In the first control, the controller forms a state where a pressure is maintained in a selected space by using a gas supplied from the selected gas supply unit or the other gas supply unit at a set pressure. The selected space includes the first gas flow channel of a selected gas supply unit, the second gas flow channel, and an internal space of a selected chamber corresponding to the selected gas supply unit among the plurality of chambers. In the second control, the controller causes a selected chamber pressure sensor for the selected chamber among the plurality of chamber pressure sensors to acquire a plurality of first pressure measurement values which are measurement values of the pressure in the selected chamber in the state. In the third control, the controller causes the reference pressure sensor to acquire a plurality of second pressure measurement values which are measurement values of the pressure in the second gas flow channel in the state. The controller is configured to perform calibration of the selected chamber pressure sensor to eliminate a difference between a pressure measurement value of the selected chamber pressure sensor, which is equal to an average value of the plurality of first pressure measurement values, and an average value of the plurality of second pressure measurement values.

In an exemplary embodiment, the substrate processing system may further include a plurality of flow splitters, a plurality of distribution flow channel groups, a plurality of gas injection units, a plurality of valves, and a plurality of pressure control valves. Each of the plurality of flow splitters is connected to a third end of a corresponding gas supply unit among a plurality of gas supply units. Each of the plurality of distribution flow channel groups includes a plurality of distribution flow channels. The plurality of distribution flow channels connect a corresponding flow splitter among the plurality of flow splitters to a corresponding chamber among the plurality of chambers. Each of the plurality of gas injection units is provided to inject a gas to one distribution flow channel included in the plurality of distribution flow channels of a corresponding distribution flow channel group among the plurality of distribution flow channel groups. Each of the plurality of valves is connected between the one distribution flow channel of the corresponding distribution flow channel group among the plurality of distribution flow channel groups and the corresponding flow splitter among the plurality of flow splitters. The plurality of pressure control valves are provided between the plurality of chambers and the plurality of exhaust apparatuses, respectively, and configured to adjust the pressure in the plurality of chambers, respectively. In the first control, the controller controls a selected valve to be closed. The selected valve is connected between the one distribution flow channel connected to the selected chamber and a flow splitter for the selected chamber among the plurality of flow splitters. In the first control, the controller controls a gas injection unit for the one distribution flow channel connected to the selected chamber among the plurality of gas injection units as the other gas supply unit to supply a gas to the selected space further including the one distribution flow channel connected to the selected chamber. In the first control, the controller controls a pressure control valve for the selected chamber among the plurality of pressure control valves to adjust the pressure in the selected chamber to the set pressure.

In an exemplary embodiment, the substrate processing system further includes the plurality of pressure control valves. The plurality of pressure control valves are provided between the plurality of chambers and the plurality of exhaust apparatuses, respectively, and configured to adjust the pressure in the plurality of chambers, respectively. In the first control, the controller controls the pressure control valve for the selected chamber among the plurality of pressure control valves to be closed and control the selected gas supply unit to supply a gas to the internal space of the selected chamber.

In an exemplary embodiment, the controller may adjust zero-point of the selected chamber pressure sensor in a state where the selected space is evacuated before the first control in the control sequence.

Hereinafter, various embodiments will be described in detail with reference to the drawings. In the drawing, the same or equivalent portions are denoted by the same reference symbols.

Figure 2:
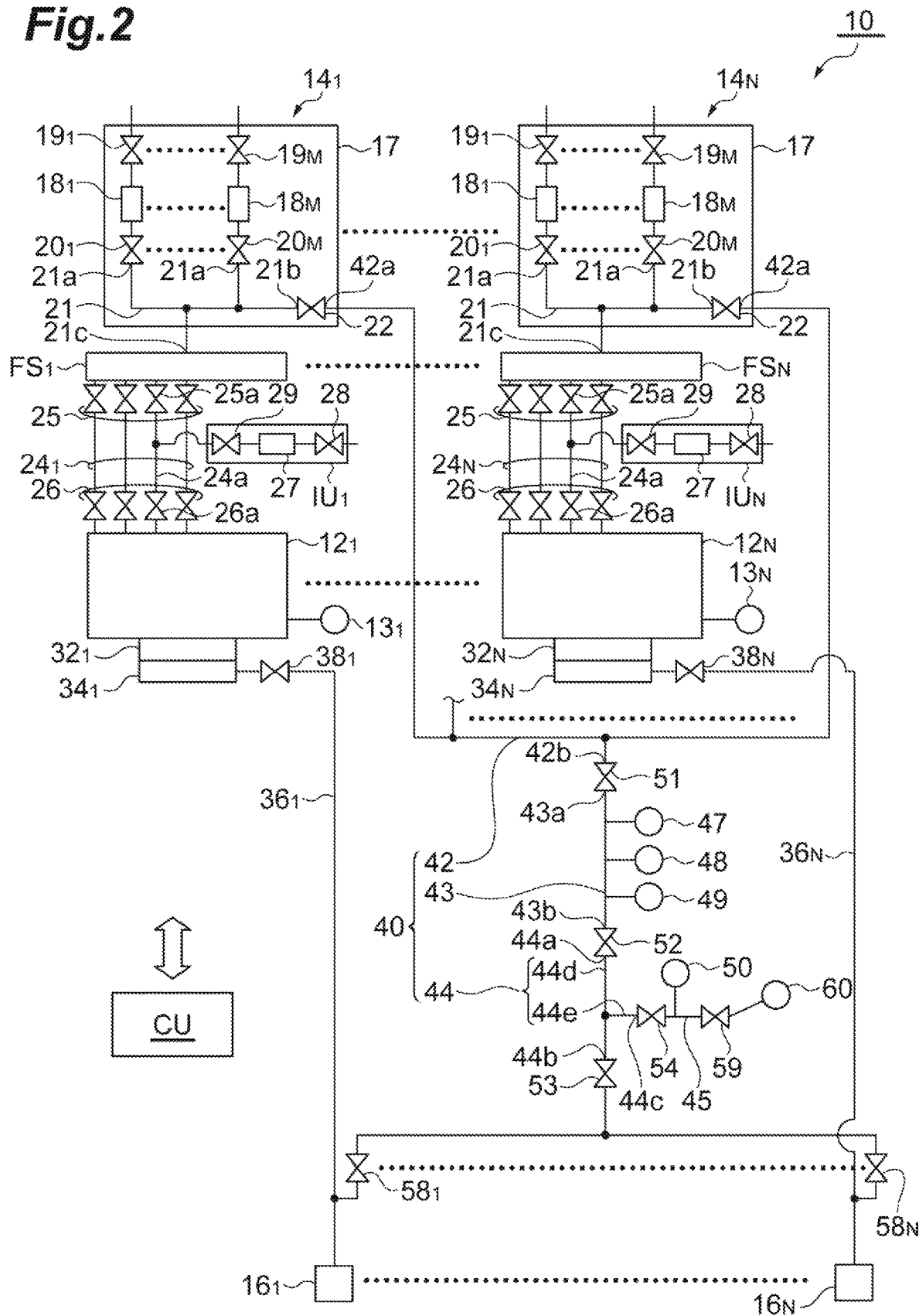
FIG. 2 schematically illustrates a substrate processing system according to an exemplary embodiment.

FIG. 1 is a flow diagram illustrating a method for calibrating a plurality of chamber pressure sensors in a substrate processing system according to an exemplary embodiment. The method shown in FIG. 1 is performed in order to calibrate the plurality of chamber pressure sensors in the substrate processing system. FIG. 2 schematically illustrates a substrate processing system according to an exemplary embodiment. The method MT shown in FIG. 1 may be performed in the substrate processing system 10 shown in FIG. 2.

The substrate processing system 10 is provided with a plurality of chambers 12, a plurality of chamber pressure sensors 13, a plurality of gas supply units 14, and a plurality of exhaust apparatuses 16. In the substrate processing system 10, each of the number of chambers 12, the number of the plurality of chamber pressure sensors 13, and the number of exhaust apparatuses 16 is N. In the substrate processing system 10, the number of gas supply units 14 may be N. "N" is an integer equal to or greater than 2. In the following description, in a case where one element among N elements of the substrate processing system 10 is referred to, the subscript of "n" is added to the end of a reference symbol indicating the element. For example, in a case where one chamber among the plurality of chambers 12 is referred to, a reference symbol of "$12_n$" is used. Here, n is an integer equal to or greater than 1. The substrate processing system 10 includes a plurality of process modules. Each of the plurality of process modules includes a chamber 12, a gas supply unit $14_n$, and an exhaust apparatus $16_n$ which have the same number n.

Each of the plurality of chambers 12 provides an internal space. Each of the plurality of chambers 12 is configured to accommodate a substrate in the internal space. The plurality of chamber pressure sensors 13 are configured to measure a pressure in the corresponding chamber among the plurality of chambers 12 (i.e. the gas pressure in an internal space of the corresponding chamber). That is, a chamber pressure sensor $13_n$ is configured to measure the pressure in the chamber $12_n$.

Each of the plurality of gas supply units 14 is configured to supply a gas to the internal space of the corresponding chamber among the plurality of chambers 12. Specifically, in the substrate processing system 10, the gas supply units $14_1$ to $14_N$ are configured to supply a gas to internal spaces of the chambers $12_1$ to $12_N$, respectively. That is, the gas supply unit $14_n$ is configured to supply a gas to an internal space of the chamber $12_n$.

Each of the plurality of gas supply units 14 includes one or more of flow rate controllers, one or more of primary valves, one or more of secondary valves, and a first gas flow channel 21. In an embodiment, each of the plurality of gas supply units 14 includes a plurality of flow rate controllers 18, a plurality of primary valves 19, a plurality of secondary valves 20, and a first gas flow channel 21. Each of the plurality of gas supply units 14 may further include a housing 17. Each of the plurality of gas supply units 14 may further include a valve 22. In an embodiment, the number of flow rate controllers 18, the number of primary valves 19, and the number of secondary valves 20 included in each of the plurality of gas supply units 14 are M. "M" is an integer equal to or greater than 2. In the following description, in a case where one element among a plurality of elements included in each of the plurality of gas supply units 14 is referred to, the subscript of "m" is added to the end of a reference symbol indicating the element. For example, in a case where one flow rate controller among the plurality of flow rate controllers 18 is referred to, the reference symbols of "$18_m$" is used. Here, m is an integer equal to or greater than 1.

The housing 17 is a container. In each of the plurality of gas supply units 14, the plurality of flow rate controllers 18, the plurality of primary valves 19, the plurality of secondary valves 20 are accommodated in the housing 17. The plurality of flow rate controllers 18 are a mass flow controller or a pressure control-type flow rate controller. The plurality of primary valves 19 are connected to the primary sides of the plurality of flow rate controllers 18, respectively. Each of the plurality of primary valves 19 is connected to a corresponding gas source provided on the primary side (upstream side) thereof. The plurality of secondary valves 20 are connected to the secondary sides of the plurality of flow rate controllers 18, respectively.

The first gas flow channel 21 includes one or more of first ends 21a, a second end 21b, and a third end 21c. In an embodiment, first gas flow channel 21 includes a plurality of first ends 21a, that is, M first ends 21a. The plurality of first ends 21a are connected to the plurality of secondary valves 20, respectively. That is, the plurality of first ends 21a are connected to the secondary sides of the plurality of flow rate controllers 18, respectively, through the plurality of secondary valves 20. The first gas flow channel 21 includes a plurality of flow channels extending from the plurality of first ends 21a. The plurality of flow channels extending from the plurality of first ends 21a are connected to a common flow channel. One end of the common flow channel of the first gas flow channel 21 is the second end 21b. A portion of the first gas flow channel 21 extending from the plurality of first ends 21a to the second end 21b is provided within the housing 17. In an embodiment, the second end 21b is connected to the valve 22. The valve 22 is provided within the housing 17.

The third end 21c is provided outside the housing 17. A flow channel including the third end 21c is connected to the common flow channel of the first gas flow channel 21. The third end 21c is provided to be connectable to the internal space of the corresponding chamber among the plurality of chambers 12. That is, the third end 21c of the first gas flow channel 21 of the gas supply unit $14_n$ is provided to be connectable to the internal space of the chamber $12_n$.

In an embodiment, the substrate processing system 10 may further include a plurality of flow splitters FS, a plurality of distribution flow channel groups 24, a plurality of gas injection units IU. The number of each of the plurality of flow splitters FS and the number of the plurality of distribution flow channel groups 24 is N. The number of the plurality of gas injection units IU may be N. An input port of each of the plurality of flow splitters FS is connected to the third end 21c of the first gas flow channel 21 of the corresponding gas supply unit among the plurality of gas supply units 14. That is, the input port of a flow splitter $FS_n$ is connected to the third end 21c of the first gas flow channel 21 of the gas supply unit $14_n$. Each of the plurality of flow splitters FS distributes a gas supplied to the input port thereof. That is, each of the plurality of flow splitters FS outputs gas supplied to the input port thereof from a plurality of output ports.

Each of the plurality of distribution flow channel groups 24 includes a plurality of distribution flow channels. In an example shown in the figure, the number of the plurality of distribution flow channels is four, but not limited thereto. The plurality of distribution flow channels included in each of the plurality of distribution flow channel groups 24 are connected in parallel between the corresponding flow splitter among the plurality of flow splitters FS and the corresponding chamber among the plurality of chambers 12. That is, the plurality of distribution flow channels of the distribution flow channel group $24_n$ are connected between the flow splitter $FS_n$ and the chamber $12_n$ in parallel. The plurality of distribution flow channels included in each of the plurality of distribution flow channel groups 24 are connected to the plurality of output ports of the corresponding flow splitter through a plurality of valves 25. The plurality of distribution flow channels included in each of the plurality of distribution flow channel groups 24 may be directly connected to the plurality of output ports of the corresponding flow splitter. The plurality of distribution flow channels included in each of the plurality of distribution flow channel groups 24 are connected to the corresponding chambers through the plurality of valves 26. To the plurality of distribution flow channels included in each of the plurality of distribution flow channel groups 24, a gas supplied from the corresponding gas supply unit to the corresponding flow splitter is distributed. The plurality of distribution flow channels included in each of the plurality of distribution flow channel groups 24 are provided to supply the gas to a plurality of different areas of the substrate disposed in the corresponding chamber, respectively. In an embodiment, the plurality of different areas of the substrate are a plurality of concentric regions where the center of the substrate is regarded as the center of the plurality of different areas.

Each of the plurality of gas injection units IU is connect to one distribution flow channel (the distribution flow channel 24a in the example shown in the figure) of the corresponding distribution flow channel group among the plurality of distribution flow channel groups 24. That is, the gas injection unit $IU_n$ is connected to the distribution flow channel 24a among the plurality of distribution flow channels of the distribution flow channel group $24_n$. Each of the plurality of gas injection units IU is configured to inject the gas to one distribution flow channel of the corresponding distribution flow channel group. In an embodiment, each of the plurality of gas injection units IU includes a flow rate controller 27, a primary valve 28, and a secondary valve 29. The primary valve 28 is connected to a primary side of the flow rate controller 27. The secondary valve 29 is connected to a secondary side of the flow rate controller 27. The flow rate controller 27 is connected to a gas source through the primary valve 28. The flow rate controller 27 is connected to one distribution flow channel of the corresponding distribution flow channel group through the secondary valve 29. The substrate processing system 10 may include more gas injection units IU than N gas injection units IU. In this case, the gas injection unit is connected to each of two or more distribution flow channels among the plurality of distribution flow channels included in each of the plurality of distribution flow channel groups 24.

The substrate processing system 10 further includes a plurality of pressure control valves 32. The substrate processing system 10 may further include a plurality of turbo-molecular pumps 34, a plurality of exhaust flow channels 36, and, a plurality of valves 38. The number of each of the pressure control valves 32, the turbo-molecular pumps 34, the exhaust flow channels 36, and the valves 38 is N. Each of the plurality of pressure control valves 32 is, for example, an automatic pressure control valve. A pressure control valve $32_n$ is configured to adjust the pressure of the internal space of the corresponding chamber $12_n$. An exhaust flow channel $36_n$ is connected to the internal space of the corresponding chamber $12_n$ through a pressure control valve $32_n$, a turbo-molecular pump $34_n$, and a valve $38_n$. At the downstream of the valve $38_n$, the exhaust apparatus $16_n$ is connected to the exhaust flow channel $36_n$. Each of the plurality of exhaust apparatuses 16 may be, for example, a dry pump.

The substrate processing system 10 further includes a second gas flow channel 40 and a reference pressure sensor 50 (the first reference pressure sensor). The second gas flow channel 40 is connected to the second end 21b of the first gas flow channel 21 of each of the plurality of gas supply units 14. In an embodiment, the second gas flow channel includes a gas flow channel 42, a gas flow channel 43, a gas flow channel 44, and a gas flow channel 45.

The gas flow channel 42 includes a plurality of ends 42a and one end 42b. The gas flow channel 42 extends from the plurality of ends 42a to the one end 42b. Each of the plurality of ends 42a is connected to the second end 21b of the first gas flow channel 21 of the corresponding gas supply unit among the plurality of gas supply units 14. In an embodiment, Each of the plurality of ends 42a is connected to the second end 21b of the first gas flow channel 21 of the corresponding gas supply unit through the valve 22 of the corresponding gas supply unit among the plurality of gas supply units 14. The gas flow channel 42 includes a plurality of flow channels including the respective ends 42a, and a common flow channel to which the plurality of flow channels are connected. The common flow channel of the gas flow channel 42 includes the end 42b.

The gas flow channel 43 includes an end 43a and an end 43b. The gas flow channel 43 extends from the end 43a to the end 43b. A valve 51 is connected between the end 42b of the gas flow channel 42 and the end 43a of the gas flow channel 43. The gas flow channel 44 has an end 44a, an end 44b, and an end 44c. The gas flow channel 44 has a partial flow channel 44d and a partial flow channel 44e. The partial flow channel 44d extends between the end 44a and the end 44b. The partial flow channel 44e is branched from the partial flow channel 44d to extend to the end 44c A valve 52 is connected between the end 43b of the gas flow channel 43 and the end 44a of the gas flow channel 44. The end 44b of the gas flow channel 44 is connected each of the plurality of exhaust apparatuses 16 through a valve 53. In an embodiment, N valves 58 are connected to the plurality of exhaust flow channels 36, respectively. The valve 53 is connected to the exhaust apparatus $16_n$ through the valve $58_n$ and the exhaust flow channel $36_n$.

A gas flow channel 45 has one end and the other end. A valve 54 is connected between the one end of the gas flow channel 45 and the end 44c of the gas flow channel 44. The valve 59 is connected to the other end of the gas flow channel 45.

The reference pressure sensor 50 is configured to measure the pressure in the second gas flow channel 40. In an embodiment, the reference pressure sensor 50 is provided between the valve 54 and the valve 59 to measure the pressure in the gas flow channel 45.

In an embodiment, the substrate processing system 10 may further includes a pressure sensor 47, a pressure sensor 48, and a temperature sensor 49. Each of the pressure sensor 47 and the pressure sensor 48 is configured to measure a pressure within the gas flow channel 43. The temperature sensor 49 is configured to measure a temperature within the gas flow channel 43.

In the method MT, as described later, a reference pressure sensor 60 (the second reference pressure sensor) may be used. The reference pressure sensor 60 may be a portable pressure sensor. The reference pressure sensor 60 is used to calibrate the reference pressure sensor 50. For example, the reference pressure sensor 60 may be shared to calibrate a reference pressure sensor of a plurality of substrate processing systems. The reference pressure sensor 60 is removably connected to the valve 59. The reference pressure sensor 60 may measure the pressure in the second gas flow channel 40 (for example, the pressure in the gas flow channel 45) at a state where the valve 59 is opened.

In an embodiment, the substrate processing system 10 may further include a controller CU. The controller CU may be a computer device including a processor such as a CPU, a storage device such as a memory, an input device such as a keyboard, a display device, and the like. The controller CU performs a control program stored in the storage device by the processor, and controls each unit of the substrate processing system 10 in accordance with recipe data stored in the storage device. The method MT may be performed by causing the controller CU to control each unit of the substrate processing system 10 and perform an arithmetic operation.

FIG. 1 will be referred to again. Hereinafter, the method MT will be described in detail. In addition, control and an arithmetic operation performed by the controller CU to perform the method MT will be described. As shown in FIG. 1, in an embodiment, the method MT further includes step STC. In step STC, calibration of the reference pressure sensor 50 is performed.

Figure 3:
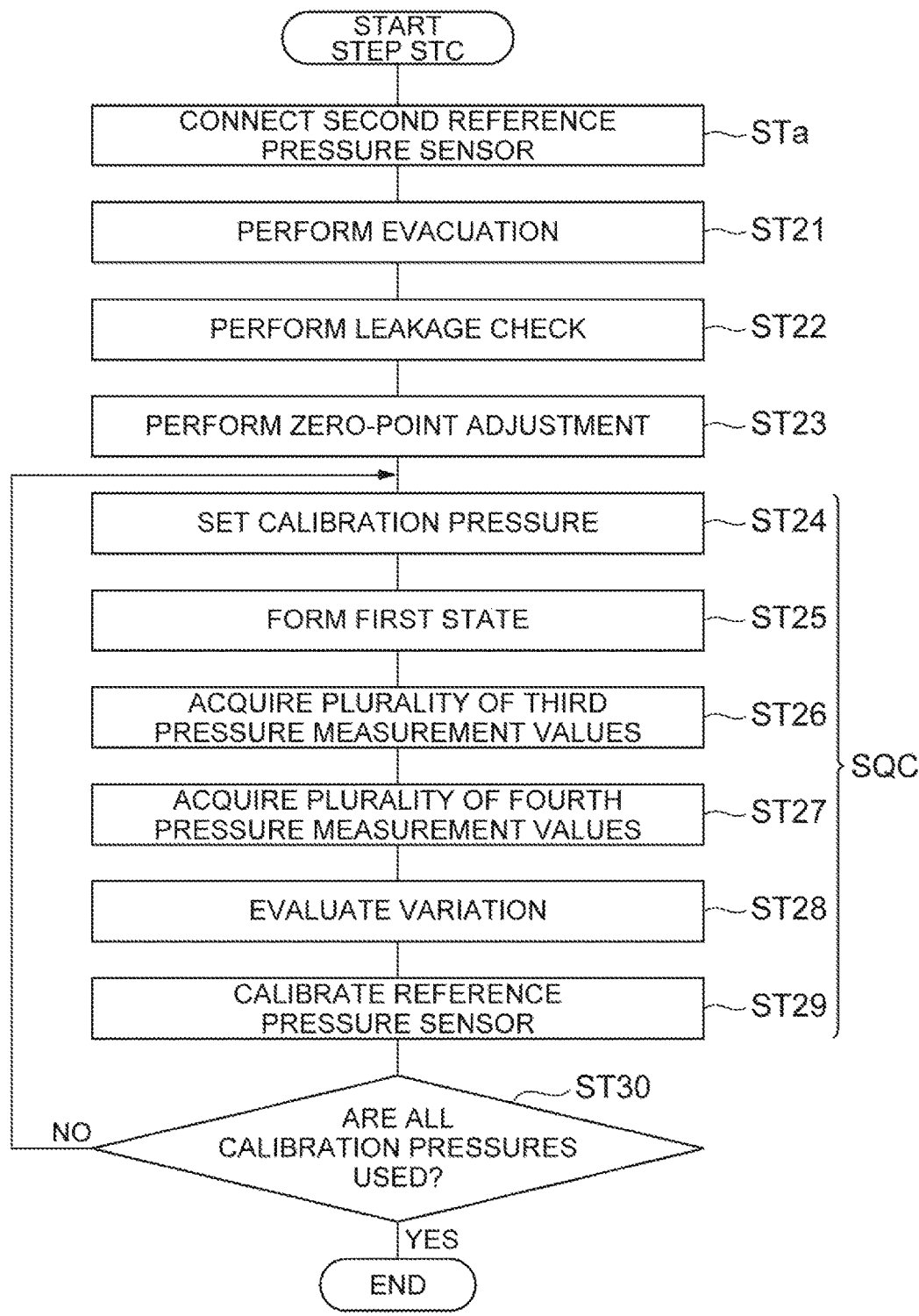
FIG. 3 is a flow diagram illustrating the detail of step STC of the method shown in FIG. 1.

FIG. 3 is a flow diagram illustrating the detail of step STC of the method shown in FIG. 1. As shown in FIG. 3, step STC starts with step STa. In step STa, the reference pressure sensor 60 is connected to the second gas flow channel 40. The reference pressure sensor 60 is connected to, for example, the valve 59.

In step STC, a plurality of different calibration pressures are used as the calibration pressure, respectively, and the reference pressure sensor 50 is calibrated by repeating sequence SQC including step ST24 to step ST29.

In an embodiment, step STC may include step ST21 to step ST23 before sequence SQC is repeated. In step ST21, a target space is evacuated. The target space includes the first gas flow channel $21_n$ of one gas supply unit $14_n$, the second gas flow channel 40, and the internal space of one chamber $12_n$. In an embodiment, the target space further includes the plurality of distribution flow channels of one distribution flow channel group $24_n$.

In order to perform step ST21, the valve 22 of the gas supply unit $14_n$, the pressure control valve $32_n$, the valve $38_n$, the valve 51, the valve 52, the valve 54, and the valve 59 are opened. In order to perform step ST21, the valve 22 of the gas supply unit except the gas supply unit $14_n$ among the plurality of gas supply units 14, the plurality of secondary valves 20 of the gas supply unit 14, and the valve 53 are closed. In addition, in order to perform step ST21, the exhaust apparatus $16_n$ is operated. The close-open operation of these valves and the operation of the exhaust apparatus $16_n$ are controlled by the controller CU.

In the subsequent step ST22, leakage check is performed. In order to perform step ST22, the valve 54 is closed. In step ST22, it is determined that the leakage occurs on a connection part of the valve 59 or the reference pressure sensor 60 in a case where the pressure measurement value obtained by the reference pressure sensor 60 is not changed or the increased amount of the pressure measurement value obtained by the reference pressure sensor 60 is equal to or greater than a predetermined value. In step ST22, in a case where it is determined that the leakage occurs, replacement or repair of a leaking part (the connection part of the valve 59 or the reference pressure sensor 60) is performed. In a case where it is determined that the leakage does not occur in step ST22, the process proceeds to step ST23.

In step ST23, zero-point of each of the reference pressure sensor 50 and reference pressure sensor 60 is adjusted. In step ST23, the reference pressure sensor 50 is calibrated so that the pressure measurement value of the reference pressure sensor 50, which is acquired in a state where the second gas flow channel 40 is evacuated in step ST21, is corrected to zero. In addition, in step ST23, the reference pressure sensor 60 is calibrated so that the pressure measurement value of the reference pressure sensor 60, which is acquired in a state where the second gas flow channel 40 is evacuated in step ST21, is corrected to zero. In step ST23, zero-point of each of the reference pressure sensor 50 and reference pressure sensor 60 is adjusted by a signal from the controller CU.

In step ST24 in sequence SQC, a calibration pressure is selected. In repetition of sequence SQC, the calibration pressure is selected in order from the plurality of different calibration pressures. In step ST24, the calibration pressure to be used may be selected from the plurality of different calibration pressures so that the calibration pressure used in the repetition of sequence SQC gradually increases.

In the subsequent step ST25, a first state where the pressure in the target space is maintained is formed. The target space includes the first gas flow channel 21 of the gas supply unit $14_n$, the second gas flow channel 40, and the internal space of the chamber $12_n$. In an embodiment, the target space further includes the plurality of distribution flow channels of one distribution flow channel group $24_n$. In an embodiment, in order to form the first state, the gas from the gas supply unit $14_n$ is used. In step ST25, the gas is supplied from the gas supply unit $14_n$, at the selected calibration pressure. The gas supply unit $14_n$, is controlled by the controller CU so that the pressure measurement value obtained by the reference pressure sensor 50 or the reference pressure sensor 60 coincides with a selected calibration pressure.

In order to perform step ST25, a primary valve $19_m$ of the gas supply unit $14_n$, a secondary valve $20_m$ of the gas supply unit $14_n$, the valve 22 of the gas supply unit $14_n$, the valve 51, the valve 52, the valve 54, and the valve 59 are opened. In order to perform step ST25, the valve 22 of the gas supply unit except the gas supply unit $14_n$ among the plurality of gas supply units 14, all the secondary valves 20 except the secondary valve $20_m$ of the gas supply unit $14_n$, and the valve 53 are closed.

In an embodiment, the pressure control valve $32_n$ is closed in order to perform step ST25. In addition, the plurality of valves 26 connected between the plurality of distribution flow channels of the distribution flow channel group $24_n$ and the chamber $12_n$ are opened. Furthermore, the plurality of valves 25 connected between the plurality of distribution flow channels of the distribution flow channel group $24_n$ and the flow splitter $FS_n$ are opened. In this embodiment, the plurality of distribution flow channels included in each of the plurality of distribution flow channel groups 24 may be directly connected to the plurality of output ports of the corresponding flow splitter. In this embodiment, the gas is supplied from a flow rate controller $18_m$, of the gas supply unit $14_n$ to the target space. In step ST25, the above described valves, pressure control valves, and flow rate controllers are controlled by the controller CU.

In another embodiment, in order to perform step ST25, the plurality of valves 26 connected between the plurality of distribution flow channels of the distribution flow channel group $24_n$ and the chamber $12_n$ are opened. In addition, one valve 25a connected to one distribution flow channel 24a among the plurality of valves 25 connected between the plurality of distribution flow channels of the distribution flow channel group $24_n$ and the flow splitter $FS_n$ are closed. Valves except the one valve 25a among the plurality of valves 25 connected between the plurality of distribution flow channels of the distribution flow channel group $24_n$ and the flow splitter $FS_n$ are opened. In addition, the valve $38_n$ is opened. Furthermore, the exhaust apparatus $16_n$ is operated. In this embodiment, in order to perform step ST25, the gas from the gas injection unit $IU_n$ which is the other gas supply unit is supplied to the one distribution flow channel 24a of the distribution flow channel group $24_n$. Specifically, the primary valve 28 and the secondary valve 29 of the gas injection unit $IU_n$ is opened, and a flow rate of the gas output from the flow rate controller 27 is adjusted. In this embodiment, the gas from the gas injection unit $IU_n$ is delivered to the target space at the selected calibration pressure. The target space includes the first gas flow channel 21 of the gas supply unit $14_n$, the second gas flow channel 40, the internal space of the chamber $12_n$, and the plurality of distribution flow channels of one distribution flow channel group $24_n$. That is, the target space further includes one distribution flow channel 24a of the distribution flow channel group $24_n$. The pressure in the internal space of the chamber $12_n$ is adjusted by a degree of opening of the pressure control valve $32_n$. The degree of opening of the pressure control valve $32_n$ may be controlled to be a predetermined degree of opening according to the selected calibration pressure. The degree of opening of the pressure control valve $32_n$ may be controlled so that the pressure measurement value of the chamber pressure sensor $13_n$ coincides with the selected calibration pressure. In step ST25, the above described valves, pressure control valves, and flow rate controllers are controlled by the controller CU.

Subsequently, step ST26 and step ST27 are performed. After a time length in which the pressure in the internal space of the chamber $12_n$ and the pressure in the second gas flow channel 40 are stabilized has elapsed in step ST25, step ST26 and step ST27 are performed. The time length may be a predetermined time length. On the other hand, the time length is determined to have elapsed when the amount of fluctuation of the pressure measurement value obtained by at least one sensor of the chamber pressure sensor $13_n$, the reference pressure sensor 50, or the reference pressure sensor 60 is equal to or less than the predetermined amount.

In step ST26, a plurality of pressure measurement values P53 (the plurality of third pressure measurement values) are acquired by the reference pressure sensor 50. The plurality of pressure measurement values P53 are measurement values of the pressure in the second gas flow channel 40 in the first state. In order to perform step ST26, the controller CU controls the reference pressure sensor 50 to acquire the plurality of pressure measurement values P53. In step ST27, a plurality of pressure measurement values P64 (the plurality of fourth pressure measurement values) are acquired by the reference pressure sensor 60. The plurality of pressure measurement values P64 are measurement values of the pressure in the second gas flow channel 40 in the first state. In order to perform step ST27, the controller CU controls the reference pressure sensor 60 to acquire the plurality of pressure measurement values P64.

In the subsequent step ST28, a variation of the plurality of pressure measurement values P53 and a variation of the plurality of pressure measurement values P64 are evaluated. The evaluation in step ST28 is performed by the controller CU. In a case where the variation of the plurality of pressure measurement values P53 is equal to or greater than the reference value, the reference pressure sensor 50 is replaced. In a case where the variation of the plurality of pressure measurement values P64 is equal to or greater than the reference value, the reference pressure sensor 60 is replaced. The variation of the plurality of pressure measurement values P53 may be evaluated by comparing each of the plurality of pressure measurement values P53 with an average value $P53_A$ of the plurality of pressure measurement values P53. The variation of the plurality of pressure measurement values P64 may be evaluated by comparing each of the plurality of pressure measurement values P64 with an average value $P64_A$ of the plurality of pressure measurement values P64.

In step ST28, the variation of the plurality of pressure measurement values P53 and the variation of the plurality of pressure measurement values P64 are evaluated by, for example, the following Expressions (1) and (2).

$$|P53_j - P53_A| < P53_R \quad (1)$$

$$|P64_j - P64_A| < P64_R \quad (2)$$

In Expressions (1) and (2), "j" denotes an index with respect to each of the plurality of pressure measurement values P53 and the plurality of pressure measurement values P64. $P53_A$ is the average value of the plurality of pressure measurement values P53. $P64_A$ is the average value of the plurality of pressure measurement values P64. $P53_R$ is a reference value, and for example, accuracy of the reference pressure sensor 50. $P64_R$ is a reference value, and for example, accuracy of the reference pressure sensor 60. In a case where Expression (1) is satisfied, the reference pressure sensor 50 is not replaced. In a case where Expression (2) is satisfied, the reference pressure sensor 60 is not replaced.

In the subsequent step ST29, the reference pressure sensor 50 is calibrated. In step ST29, the reference pressure sensor 50 is calibrated to eliminate a difference between a pressure measurement value which is equal to the average value $P53_A$ and obtained by the reference pressure sensor 50, and the average value $P64_A$. In step ST29 of an example, in order to calibrate the reference pressure sensor 50, the difference between the average value $P53_A$ and the average value $P64_A$ may be obtained as a correction amount. In this example, the correction amount is applied to the reference pressure sensor 50, so that the reference pressure sensor 50 is calibrated. In step ST29 of another example, a coefficient, which enables to obtain a pressure measurement value substantially equal to the average value $P64_A$ by multiplying the average value $P53_A$ by the coefficient, is determined. The reference pressure sensor 50 is calibrated by setting the coefficient to the reference pressure sensor 50. The arithmetic operation in step ST29 and calibration of the reference pressure sensor 50 are performed by the controller CU.

In the subsequent step ST30, it is determined whether or not all the calibration pressures are used. In a case where all the calibration pressures are not used, a calibration pressure which is not used is selected from the plurality of calibration pressures, and sequence SQC is performed again. On the other hand, in a case where all the calibration pressures are used, step STC ends. After step STC ends, the valve 59 may be closed, and the reference pressure sensor 60 may be removed from the valve 59.

As shown in FIG. 1, after step STC is performed, sequence SQ is repeated, so that the plurality of chamber pressure sensors 13 are calibrated. In the method MT, the plurality of chamber pressure sensors 13 are selected in order as the chamber pressure sensor $13_n$. The chamber pressure sensor $13_n$ is selected in step ST1. In the method MT, by using the plurality of different set pressures in repetition of sequence SQ, respectively, the selected chamber pressure sensor $13_n$ is calibrated.

In an embodiment, the method MT may include step ST2 to step ST3 before sequence SQ is repeated. In step ST2, the selected space is evacuated. The selected space includes the first gas flow channel 21 of the gas supply unit $14_g$. The second gas flow channel 40, and the internal space of the chamber $12_n$. The chamber $12_n$ is a selected chamber corresponding to the selected chamber pressure sensor $13_n$. The pressure in the chamber $12_n$ is measured by the selected chamber pressure sensor $13_n$. The gas supply unit $14_n$ is the selected gas supply unit corresponding to the chamber $12_n$ and configured to supply the gas to the internal space of the chamber $12_n$. In an embodiment, a selected space further includes the plurality of distribution flow channels of the distribution flow channel group $24_n$. The distribution flow channel group $24_n$ is connected between the chamber $12_n$ and the flow splitter $FS_n$.

In order to perform step ST2, the valve 22 of the gas supply unit $14_n$, the pressure control valve $32_n$ the valve $38_n$, the valve 51, the valve 52, the valve 54 are opened. In order to perform step ST2, the valve 22 of the gas supply unit except the gas supply unit $14_n$ among the plurality of gas supply units 14, the plurality of secondary valves 20 of the gas supply unit $14_n$, the valve 53, the valve 59 are closed. In addition, in order to perform step ST2, the exhaust apparatus $16_n$ is operated. The close-open operation of these valves and the operation of the exhaust apparatus $16_n$ are controlled by the controller CU.

In step ST3, zero-point of the chamber pressure sensor $13_n$ is adjusted. In step ST3, the chamber pressure sensor $13_n$ is calibrated so that the pressure measurement value of the chamber pressure sensor $13_n$, which is acquired in a state where the internal space of the chamber $12_n$ is evacuated in step ST2, is corrected to zero. In step ST3, zero-point of the chamber pressure sensor $13_n$ is adjusted by a signal from the controller CU.

In step ST4 in sequence SQ, a set pressure is selected. In repetition of sequence SQ, the set pressure is selected in order from the plurality of different set pressures. In step ST4, the set pressure to be used may be selected from the plurality of different set pressures so that the set pressure used in the repetition of sequence SQ gradually increases.

In the subsequent step ST5, a second state where the pressure in the selected space is maintained is formed. The selected space includes the first gas flow channel 21 of the gas supply unit $14_n$, the second gas flow channel 40, and the internal space of the chamber $12_n$. In an embodiment, the selected space further includes the plurality of distribution flow channels of the distribution flow channel group $24_n$. In an embodiment, in order to form the second state, the gas from the gas supply unit $14_n$ is used. In step ST5, the gas is supplied from the gas supply unit $14_n$ at the selected set pressure. The gas supply unit $14_n$ is controlled by the controller CU so that the pressure measurement value obtained by the reference pressure sensor 50 coincides with the selected set pressure.

In order to perform step ST5, the primary valve $19_m$ of the gas supply unit $14_n$, the secondary valve $20_m$ of the gas supply unit $14_n$, the valve 22 of the gas supply unit $14_n$, the valve 51, the valve 52, and the valve 54 are opened. In order to perform step ST5, the valve 22 of the gas supply unit except the gas supply unit $14_n$ among the plurality of gas supply units 14, all the secondary valves 20 except the secondary valve $20_m$ of the gas supply unit $14_n$, the valve 53, and the valves 59 are closed.

In an embodiment, the pressure control valve $32_n$ is closed in order to perform step ST5. In addition, the plurality of valves 26 connected between the plurality of distribution flow channels of the distribution flow channel group $24_n$ and the chamber $12_n$ are opened. Furthermore, the plurality of valves 25 connected between the plurality of distribution flow channels of the distribution flow channel group $24_n$ and the flow splitter $FS_n$ are opened. In this embodiment, the plurality of distribution flow channels included in each of the plurality of distribution flow channel groups 24 may be directly connected to the plurality of output ports of the corresponding flow splitter. In this embodiment, the gas is supplied from a flow rate controller $18_m$ of the gas supply unit $14_n$ to the selected space. In step ST5, the above described valves, pressure control valves, and flow rate controllers are controlled by the controller CU.

In another embodiment, in order to perform step ST5, the plurality of valves 26 connected between the plurality of distribution flow channels of the distribution flow channel group $24_n$ and the chamber $12_n$ are opened. In addition, the one valve 25a among the plurality of valves 25 connected between the plurality of distribution flow channels of the distribution flow channel group $24_n$ and the flow splitter $FS_n$ is closed. Valves except the one valve 25a among the plurality of valves 25 connected between the plurality of distribution flow channels of the distribution flow channel group $24_n$ and the flow splitter $FS_n$ are opened. In addition, the valve $38_n$ is opened. Furthermore, the exhaust apparatus $16_n$ is operated. In this embodiment, in order to perform step ST5, the gas from the gas injection unit $IU_n$ which is the other gas supply unit is supplied to the one distribution flow channel 24a of the distribution flow channel group $24_n$. Specifically, the primary valve 28 and the secondary valve 29 of the gas injection unit $IU_n$ is opened, and a flow rate of the gas output from the flow rate controller 27 is adjusted. In this embodiment, the gas from the gas injection unit $IU_n$ is delivered to the selected space at the selected set pressure. The selected space includes the first gas flow channel 21 of the gas supply unit $14_n$, the second gas flow channel 40, the internal space of the chamber $12_n$, and the plurality of distribution flow channels of the distribution flow channel group $24_n$. That is, the selected space further includes one distribution flow channel 24a of the distribution flow channel group $24_n$. The pressure in the internal space of the chamber $12_n$ is adjusted by a degree of opening of the pressure control valve $32_n$. The degree of opening of the pressure control valve $32_n$ may be controlled to be a predetermined degree of opening according to the selected set pressure. The degree of opening of the pressure control valve $32_n$ may be controlled so that the pressure measurement value of the chamber pressure sensor $13_n$ coincides with the selected set pressure. In step ST5, the above described valves, pressure control valves, and flow rate controllers are controlled by the controller CU.

Subsequently, step ST6 and step ST7 are performed. After a time length in which the pressure in the internal space of the chamber $12_n$ and the pressure in the second gas flow channel 40 are stabilized has elapsed in step ST5, step ST6 and step ST7 are performed. The time length may be a predetermined time length. On the other hand, the time length is determined to have elapsed when the amount of fluctuation of the pressure measurement value obtained by at least one sensor of the chamber pressure sensor $13_n$ or the reference pressure sensor 50 is equal to or less than the predetermined amount.

In step ST6, a plurality of pressure measurement values PC (the plurality of first pressure measurement values) are acquired by the chamber pressure sensor $13_n$. The plurality of pressure measurement values PC are measurement values of the pressure in the chamber $12_n$ in the second state. In order to perform step ST6, the controller CU controls the chamber pressure sensor $13_n$ to acquire the plurality of pressure measurement values PC. In step ST7, a plurality of pressure measurement values P52 (the plurality of second pressure measurement values) are acquired by the reference pressure sensor 50. The plurality of pressure measurement values P52 are measurement values of the pressure in the second gas flow channel 40 in the second state. In order to perform step ST7, the controller CU controls the reference pressure sensor 50 to acquire the plurality of pressure measurement values P52.

In the subsequent step ST8, a variation of the plurality of pressure measurement values PC and a variation of the plurality of pressure measurement values P52 are evaluated. The evaluation in step ST8 is performed by the controller CU. In a case where the variation of the plurality of pressure measurement values PC is equal to or greater than the reference value, the chamber pressure sensor $13_n$ is replaced. In a case where the variation of the plurality of pressure measurement values P52 is equal to or greater than the reference value, the reference pressure sensor 50 is replaced. The variation of the plurality of pressure measurement values PC may be evaluated by comparing each of the plurality of pressure measurement values PC with an average value $PC_A$ of the plurality of pressure measurement values PC. The variation of the plurality of pressure measurement values P52 may be evaluated by comparing each of the plurality of pressure measurement values P52 with an average value $P52_A$ of the plurality of pressure measurement values P52.

In step ST8, the variation of the plurality of pressure measurement values PC and the variation of the plurality of pressure measurement values P52 are evaluated by, for example, the following Expressions (3) and (4).

$$|PC_j - PC_A| < PC_R \qquad (3)$$

$$|P52_j - P52_A| < P52_R \qquad (4)$$

In Expressions (3) and (4), "j" denotes an index with respect to each of the plurality of pressure measurement values PC and the plurality of pressure measurement values P52. $PC_A$ is the average value of the plurality of pressure measurement values PC. $P52_A$ is the average value of the plurality of pressure measurement values P52. $PC_R$ is a reference value, and for example, accuracy of the chamber pressure sensor $13_n$. $P52_R$ is a reference value, and for example, accuracy of the reference pressure sensor 50. In a case where Expression (3) is satisfied, the chamber pressure sensor $13_n$ is not replaced. In a case where Expression (4) is satisfied, the reference pressure sensor 50 is not replaced.

In step ST9, the chamber pressure sensor $13_n$ is calibrated. In step ST9, the chamber pressure sensor $13_n$ is calibrated to eliminate a difference between a pressure measurement value which is equal to the average value $PC_A$ and obtained by the chamber pressure sensor $13_n$, and the average value $P52_A$. In step ST9 of an example, in order to calibrate the chamber pressure sensor $13_n$, the difference between the average value $PC_A$ and the average value $P52_A$ may be obtained as a correction amount. In this example, the correction amount is applied to the reference pressure sensor 50, so that the reference pressure sensor 50 is calibrated. In step ST9 of another example, a coefficient, which enables to obtain a pressure measurement value substantially equal to the average value $P52_A$ by multiplying the average value $PC_A$ by the coefficient, is determined. The chamber pressure sensor $13_n$ is calibrated by setting the coefficient to the chamber pressure sensor $13_n$. The arithmetic operation in step ST9 and calibration of the chamber pressure sensor $13_n$ are performed by the controller CU.

In the subsequent step ST10, it is determined whether or not all the set pressures are used. In a case where all the set pressures are not used, a set pressure which is not used is selected from the plurality of set pressures, and sequence SQ is performed again. On the other hand, in a case where all the set pressures are used, the process proceeds to step ST11.

In the subsequent step ST11, it is determined whether or not all the chamber pressure sensors 13 are selected. In a case where all the chamber pressure sensors 13 are not selected, a chamber pressure sensor which is not selected is selected from the plurality of chamber pressure sensors 13, and processing from step ST1, that is, processing including sequence SQ is performed again. On the other hand, in a case where all the chamber pressure sensors 13 have already been selected, the method MT ends.

According to the method MT, the plurality of chamber pressure sensors 13 are calibrated by using one reference pressure sensor 50. Therefore, a machine difference of the plurality of chamber pressure sensors 13 is reduced. In addition, the plurality of chamber pressure sensors 13 are calibrated by using the measurement value of the pressure existing in the common second gas flow channel 40 and acquired by the reference pressure sensor 50. Therefore, the calibration of the plurality of chamber pressure sensors 13 may be easily performed.

While various exemplary embodiments have been described above, various additions, omissions, substitutions and changes may be made without being limited to the exemplary embodiments described above. Elements of the different embodiments may be combined to form another embodiment.

For example, in the method MT, the pressure sensor 47 or the pressure sensor 48 may be used instead of the reference pressure sensor 50.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for calibrating a plurality of chamber pressure sensors in a substrate processing system, wherein the substrate processing system includes:
a plurality of chambers;
the plurality of chamber pressure sensors provided to measure pressures in the plurality of chambers, respectively;
a plurality of gas supply units each configured to supply a gas to an internal space of a corresponding chamber among the plurality of chambers and each including
a flow rate controller,
a primary valve connected to a primary side of the flow rate controller,
a secondary valve connected to a secondary side of the flow rate controller, and
a first gas flow channel including a first end, a second end, and a third end, the first end being connected to the secondary valve and the third end being connectable to the internal space of the corresponding chamber,
a plurality of exhaust apparatuses connected to internal spaces of the plurality of chambers through a plurality of exhaust flow channels, respectively;
a second gas flow channel connected to the second end of each of the plurality of gas supply units; and
a reference pressure sensor provided to measure a pressure in the second gas flow channel,
the method comprising:
forming a state where a pressure is maintained in a selected space including the first gas flow channel of a selected gas supply unit among the plurality of gas supply units, the second gas flow channel, and the internal space of a selected chamber corresponding to the selected gas supply unit among the plurality of chambers, wherein the state is formed by a gas supplied from the selected gas supply unit or an other gas supply unit at a set pressure;
acquiring a plurality of first pressure measurement values which are measurement values of the pressure in the selected chamber in the state by using a selected chamber pressure sensor for the selected chamber among the plurality of chamber pressure sensors;
acquiring a plurality of second pressure measurement values which are measurement values of the pressure in the second gas flow channel in the state by using the reference pressure sensor; and
calibrating the selected chamber pressure sensor to eliminate a difference between a pressure measurement value of the selected chamber pressure sensor, which is equal to an average value of the plurality of first pressure measurement values, and an average value of the plurality of second pressure measurement values,
wherein a sequence including said forming a state, said acquiring a plurality of first pressure measurement values, said acquiring a plurality of second pressure measurement values, and said calibrating the selected chamber pressure sensor is repeated, by using a plurality of different set pressures as the set pressure respectively and
the plurality of chamber pressure sensors are selected in order as the selected chamber pressure sensor and the sequence is repeated.

2. The method according to claim 1,
wherein the substrate processing system further includes:
a plurality of flow splitters each connected to the third end of a corresponding gas supply unit among the plurality of gas supply units;
a plurality of distribution flow channel groups each including a plurality of distribution flow channels connecting a corresponding flow splitter among the plurality of flow splitters to a corresponding chamber among the plurality of chambers;

a plurality of gas injection units each provided to inject a gas to one distribution flow channel included in the plurality of distribution flow channels of a corresponding distribution flow channel group among the plurality of distribution flow channel groups;

a plurality of valves each connected between the one distribution flow channel of the corresponding distribution flow channel group among the plurality of distribution flow channel groups and the corresponding flow splitter among the plurality of flow splitters; and a plurality of pressure control valves provided between the plurality of chambers and the plurality of exhaust apparatuses, respectively, and configured to adjust pressures in the plurality of chambers, respectively, and wherein in said forming a state, a selected valve among the plurality of valves, which is connected between the one distribution flow channel connected to the selected chamber and a flow splitter for the selected chamber among the plurality of flow splitters, is closed, a gas is supplied from a gas injection unit for the one distribution flow channel connected to the selected chamber among the plurality of gas injection units as the other gas supply unit to the selected space further including the one distribution flow channel connected to the selected chamber, and a pressure in the selected chamber is adjusted to the set pressure by a pressure control valve for the selected chamber among the plurality of pressure control valves.

3. The method according to claim 1, wherein the substrate processing system further includes a plurality of pressure control valves provided between the plurality of chambers and the plurality of exhaust apparatuses, respectively, and configured to adjust pressures in the plurality of chambers, respectively, and wherein in the forming a state, the gas is supplied from the selected gas supply unit to the selected space in a state where the pressure control valve for the selected chamber among the plurality of pressure control valves is closed.

4. The method according to claim 1, further comprising adjusting zero-point of the selected chamber pressure sensor in a state where the selected space is evacuated before said forming a state in the sequence.

5. The method according to claim 1, further comprising comparing each of the plurality of first pressure measurement values with the average value of the plurality of first pressure measurement values in the sequence.

6. The method according to claim 1, further comprising comparing each of the plurality of second pressure measurement values with the average value of the plurality of second pressure measurement values in the sequence.

7. The method according to claim 1, further comprising performing calibration of a first reference pressure sensor which is the reference pressure sensor before repeating the sequence performed in order with respect to the plurality of chamber pressure sensors, wherein said performing calibration of a first reference pressure sensor including:

connecting a second reference pressure sensor to the second gas flow channel;

framing an other state where a pressure is maintained in a target space including the first gas flow channel of one gas supply unit among the plurality of gas supply units, the second gas flow channel, and an internal space of one chamber corresponding to the one gas supply unit among the plurality of chambers, in which the other state is formed by a gas supplied from the one gas supply unit or the other gas supply unit at a calibration pressure;

acquiring a plurality of third pressure measurement values which are measurement values of the pressure in the second gas flow channel in the other state by using the first reference pressure sensor;

acquiring a plurality of fourth pressure measurement values which are measurement values of the pressure in the second gas flow channel in the other state by using the second reference pressure sensor; and calibrating the first reference pressure sensor to eliminate a difference between a pressure measurement value of the first reference pressure sensor, which is equal to an average value of the plurality of third pressure measurement values, and an average value of the plurality of fourth pressure measurement values, and wherein an other sequence including said forming an other state, said acquiring a plurality of third pressure measurement values, said acquiring a plurality of fourth pressure measurement values, and said calibrating the first reference pressure sensor is repeated, by using a plurality of different calibration pressures as the calibration pressure, respectively.

8. The method according to claim 7, wherein the substrate processing system further includes:

a plurality of flow splitters each connected to the third end of a corresponding gas supply unit among the plurality of gas supply units;

a plurality of distribution flow channel groups each including a plurality of distribution flow channels connecting a corresponding flow splitter among the plurality of flow splitters to a corresponding chamber among the plurality of chambers;

a plurality of gas injection units each provided to inject a gas to one distribution flow channel included in the plurality of distribution flow channels of a corresponding distribution flow channel group among the plurality of distribution flow channel groups;

a plurality of valves each connected between the one distribution flow channel of the corresponding distribution flow channel group among the plurality of distribution flow channel groups and the corresponding flow splitter among the plurality of flow splitters; and a plurality of pressure control valves provided between the plurality of chambers and the plurality of exhaust apparatuses, respectively, and configured to adjust the pressure in the plurality of chambers, respectively, and wherein in said forming an other state, one valve among the plurality of valves is closed, and the one valve being connected between the one distribution flow channel connected to the one chamber and a flow splitter for the one chamber among the plurality of flow splitters, a gas is supplied from a gas injection unit for the one distribution flow channel connected to the one chamber among the plurality of gas injection units as the other gas supply unit to the target space further including the one distribution flow channel connected to the one chamber, and a pressure in the one chamber is adjusted to the calibration pressure by the pressure control valve for the one chamber among the plurality of pressure control valves.

9. The method according to claim 7,
wherein the substrate processing system further includes a plurality of pressure control valves provided between the plurality of chambers and the plurality of exhaust apparatuses, respectively, and configured to adjust the pressure in the plurality of chambers respectively, and
wherein in the forming an other state, the gas is supplied from the one gas supply unit to the target space in a state where the pressure control valve for the one chamber among the plurality of pressure control valves is closed.

10. The method according to claim 7, further comprising adjusting zero-point of each of the first reference pressure sensor and the second reference pressure sensor in a state where the target space is evacuated before repeating the other sequence.

11. The method according to claim 7, further comprising comparing each of the plurality of third pressure measurement values with the average value of the plurality of third pressure measurement values in the other sequence.

12. The method according to claim 7, further comprising comparing each of the plurality of fourth pressure measurement values with the average value of the plurality of fourth pressure measurement values in the other sequence.

13. A substrate processing system comprising:
a plurality of chambers;
a plurality of chamber pressure sensors provided to measure pressures in the plurality of chambers, respectively;
a plurality of gas supply units each configured to supply a gas to an internal space of a corresponding chamber among the plurality of chambers and each including
a flow rate controller,
a primary valve connected to a primary side of the flow rate controller,
a secondary valve connected to a secondary side of the flow rate controller, and
a first gas flow channel including a first end, a second end, and a third end, the first end being connected to the secondary valve and the third end being connectable to the internal space of the corresponding chamber,
a plurality of exhaust apparatuses connected to internal spaces of the plurality of chambers through a plurality of exhaust flow channels, respectively;
a second gas flow channel connected to the second end of each of the plurality of gas supply units;
a reference pressure sensor provided to measure a pressure in the second gas flow channel; and
a controller configured to perform control for calibration of the plurality of chamber pressure sensors,
wherein the controller is configured to perform:
a first control of controlling a selected gas supply unit among the plurality of gas supply units or an other gas supply unit to form a state where a pressure is maintained in a selected space including the first gas flow channel of the selected gas supply unit, the second gas flow channel, and the internal space of a selected chamber corresponding to the selected gas supply unit among the plurality of chambers by using a gas supplied from the selected gas supply unit or the other gas supply unit at a set pressure;
a second control of controlling a selected chamber pressure sensor for the selected chamber among the plurality of chamber pressure sensors to acquire a plurality of first pressure measurement values which are measurement values of the pressure in the selected chamber in the state;
a third control of controlling the reference pressure sensor to acquire a plurality of second pressure measurement values which are measurement values of the pressure in the second gas flow channel in the state;
calibration of the selected chamber pressure sensor to eliminate a difference between a pressure measurement value of the selected chamber pressure sensor, which is equal to an average value of the plurality of first pressure measurement values, and an average value of the plurality of second pressure measurement values; and
repetition of control sequence including the first control, the second control, the third control, and the calibration of the selected chamber pressure sensor by selecting the plurality of chamber pressure sensors in order as the selected chamber pressure sensor and using a plurality of different set pressures as the set pressure, respectively.

14. The substrate processing system according to claim 13, further comprising:
a plurality of flow splitters each connected to the third end of a corresponding gas supply unit among the plurality of gas supply units;
a plurality of distribution flow channel groups each including a plurality of distribution flow channels connecting a corresponding flow splitter among the plurality of flow splitters to a corresponding chamber among the plurality of chambers;
a plurality of gas injection units each provided to inject a gas to one distribution flow channel included in the plurality of distribution flow channels of a corresponding distribution flow channel group among the plurality of distribution flow channel groups;
a plurality of valves each connected between the one distribution flow channel of the corresponding distribution flow channel group among the plurality of distribution flow channel groups and the corresponding flow splitter among the plurality of flow splitters; and
a plurality of pressure control valves provided between the plurality of chambers and the plurality of exhaust apparatuses, respectively, and configured to adjust pressures in the plurality of chambers, respectively, and
wherein the controller is configured to control, in the first control,
a selected valve among the plurality of valves to be closed, wherein the selected valve is connected between the one distribution flow channel connected to the selected chamber and a flow splitter for the selected chamber among the plurality of flow splitters,
a gas injection unit for the one distribution flow channel connected to the selected chamber among the plurality of gas injection units as the other gas supply unit to supply a gas to the selected space further including the one distribution flow channel connected to the selected chamber, and
a pressure control valve for the selected chamber among the plurality of pressure control valves to adjust the pressure in the selected chamber to the set pressure.

15. The substrate processing system according to claim 13, further comprising a plurality of pressure control valves provided between the plurality of chambers and the plurality of exhaust apparatuses, respectively, and configured to adjust the pressure in the plurality of chambers, respectively, wherein the controller is configured to control, in the first control, a pressure control valve for the selected chamber among the plurality of pressure control valves to be closed and control the selected gas supply unit to supply a gas to the selected space.

16. The substrate processing system according to claim 13, wherein the controller is configured to adjust zero-point of the selected chamber pressure sensor in a state where the selected space is evacuated before the first control in the control sequence.

* * * * *